United States Patent
Tseng et al.

(10) Patent No.: US 8,519,375 B2
(45) Date of Patent: Aug. 27, 2013

(54) NON-VOLATILE MEMORY WITH OXYGEN VACANCY BARRIER LAYER

(75) Inventors: Tseung-Yuen Tseng, Hsinchu (TW); Dai-Ying Lee, Hsinchu County (TW)

(73) Assignee: Winbond Electronics Corp., Taichung (TW)

( * ) Notice: Subject to any disclaimer, the term of this patent is extended or adjusted under 35 U.S.C. 154(b) by 232 days.

(21) Appl. No.: 13/089,880

(22) Filed: Apr. 19, 2011

(65) Prior Publication Data
US 2012/0267596 A1    Oct. 25, 2012

(51) Int. Cl.
*H01L 47/00*   (2006.01)
(52) U.S. Cl.
USPC ........................ 257/4; 257/E47.001
(58) Field of Classification Search
CPC . H01L 27/2418; H01L 27/2409; H01L 27/24; H01L 45/145; H01L 45/08
USPC .................. 257/536, 537, E29.006
See application file for complete search history.

(56) References Cited

U.S. PATENT DOCUMENTS
2007/0215977 A1   9/2007 Lee et al.
2010/0110758 A1   5/2010 Li et al.
2011/0149634 A1*  6/2011 Schloss et al. ............... 365/148

OTHER PUBLICATIONS

Sun et al. Higly uniform resistive switching characteristics of TiN/ZrO2/Pt memory devices, Mar. 16, 2009, J. Appl. Phys. 105, 061630(2009).*
Chu, B.S. editor, "Electronic Ceramic Materials," Chapter 7, Apr. 5, 1996, National Institute for Compilation and Translation.
Kim, D.C. et al.,"Improvement of resistive memory switching in NiO using IrO2," Applied Physics Letters, 2006, pp. 232106-1-3, vol. 88.
I.G. Baek et al.,"Multi-layer Cross-point Binary Oxide Resistive Memory (OxRRAM) for Post-NAND Storage Application," IEEE, 2005.

* cited by examiner

*Primary Examiner* — Eva Yan Montalvo
(74) *Attorney, Agent, or Firm* — Muncy, Geissler, Olds & Lowe, PLLC

(57) ABSTRACT

An exemplary embodiment of a non-volatile memory includes a bottom conductive layer, a resistive switching layer, an oxygen vacancy barrier layer and an upper conductive layer. The resistive switching layer is disposed on the bottom conductive layer. The oxygen vacancy barrier layer is disposed on the resistive switching layer. The upper conductive layer is disposed on the oxygen vacancy barrier layer.

10 Claims, 5 Drawing Sheets

NON-VOLATILE MEMORY WITH OXYGEN VACANCY BARRIER LAYER

BACKGROUND

1. Field of the Invention

The present invention relates to a non-volatile memory, and in particular, to a resistive non-volatile memory.

2. Description of the Related Art

Flash memory technology is currently the most dominant non-volatile memory technology around, but faces challenges due to disadvantages, such as requirement for high operation voltages, slow operation speeds and poor data retention. Thus, future development thereof has been hindered. Moreover, with the device scaling technology trend, the tunneling effect of ultra-thin gate oxide layers of flash memories has resulted in poor data retention performances of flash memories.

Thus, many new non-volatile memories comprising magnetoresistive random access memories (MRAM), ovonic unified memories (OUM) and resistive non-volatile memories (such as resistive random-access memories, RRAM) have been developed in an attempt to replace flash memories. Among them, resistive non-volatile memories are provided with low power consumption, low operating voltage, high write and erase speeds, long endurance, long retention time, nondestructive reading, multiple memory states, simple fabrication processes, and small sizes. Baek et al. [I. G. Baek et al., in *Tech. Dig. of IEDM* (2005)] provides a plug bottom electrode to decrease the resistance variation between two stable states. Kim et al. [D. C. Kim et al., *Appl. Phys. Lett.*, 88, 232106 (2006)] provides an $IrO_2$ buffer layer to improve the resistance variation between two stable states, thereby eliminating the problem of memory write failure.

The conventional resistive non-volatile memories suffer an unstable resistive switching problem, and consequently their applications for a non-volatile memory are restricted. Meanwhile, there are two structures for non-volatile memories. One structure is constructed by one transistor and one resistor (1T1R), and the other structure is constructed by one diode and one resistor (1D1R). The 1D1R resistive non-volatile memory has advantages of extreme device scaling, but it has to be associated with a resistor having unipolar resistive switching behavior to achieve 1D1R resistive non-volatile memory functions.

Thus, a non-volatile memory operating under the unipolar resistive switching condition with advantages of long endurance, long retention time, simple fabrication processes and low cost is desired.

BRIEF SUMMARY

An exemplary embodiment of a non-volatile memory includes a bottom conductive layer, a resistive switching layer, an oxygen vacancy barrier layer and an upper conductive layer. The resistive switching layer is disposed on the bottom conductive layer. The oxygen vacancy barrier layer is disposed on the resistive switching layer. The upper conductive layer is disposed on the oxygen vacancy barrier layer.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION

Figure 1A:
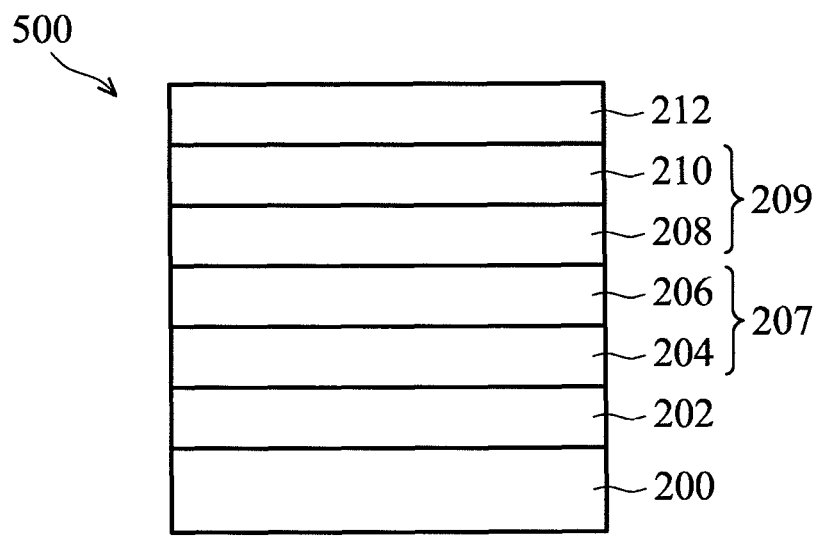
FIG. 1*a* is a cross section showing one exemplary embodiment of a non-volatile memory of the invention.

The following description is of a mode for carrying out the exemplary embodiments. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice of the invention.

In accordance with the present invention, a non-volatile memory using a resistance change for memorizing data is provided. In an embodiment, the non-volatile memory uses a precious metal as a bottom electrode, and then a $ZrO_2$ film is formed as a resistive switching layer on the bottom electrode. Next, a CaO-doped $ZrO_2$ ($CaO:ZrO_2$) is formed as an oxygen vacancy barrier layer on the resistive switching layer to form a bilayered oxide film structure. Further, an active metal serves as an upper electrode to change the oxygen state and distribution within the bilayered oxide film structure. As a result, the endurance and stability of a non-volatile memory under unipolar resistive switching behavior operations can be significantly improved.

FIG. 1*a* is a cross section showing one exemplary embodiment of a non-volatile memory 500 of the invention. The non-volatile memory 500 is disposed on the substrate 200. The non-volatile memory 500 essentially comprises an insulating layer 202 disposed on the substrate 200, a bottom conductive layer 207 disposed on the insulating layer 202, a resistive switching layer 208 disposed on the bottom conductive layer 207, an oxygen vacancy barrier layer 210 disposed on the resistive switching layer 208, and an upper conductive layer 212 disposed on the oxygen vacancy barrier layer. In an embodiment, the resistive switching layer 208 and the overlying oxygen vacancy barrier layer 210 may together form a bilayered oxide film structure 209 of the non-volatile memory 500.

In one embodiment, the substrate 200 may comprise a silicon substrate. The insulating layer 202 may comprise a silicon dioxide (SiO$_2$) film having a thickness of about 100 nm to 500 nm. The bottom conductive layer 207 serving as a bottom electrode may comprise a composite layer by stacking two metal layers. As shown in FIG. 1a, the bottom conductive layer 207 may comprise a titanium (Ti) film 204 and a platinum (Pt) film 206 stacked on the titanium (Ti) film 204. The bottom conductive layer 207 may have a thickness of about 10 nm to 1000 nm. The resistive switching layer 208 may comprise a ZrO$_2$ film having a thickness of about 100 nm to 500 nm. The oxygen vacancy barrier layer 210 may comprise a ZrO$_2$ film having a metal oxide dopant, wherein the metal oxide dopant comprises CaO, MgO, Y$_2$O$_3$ or combinations thereof. Further, the oxygen vacancy barrier layer 210 may have a thickness of about 1 nm to 1000 nm. The upper conductive layer 212 comprising a titanium (Ti) or titanium nitride (TiN) film may serve as an upper electrode and have a thickness of about 10 nm to 1000 nm.

In an embodiment of a method for fabricating the non-volatile memory 500, a substrate 200, such as a silicon substrate, is first provided and then cleaned by a standard Radio Corporation of America (RCA) cleaning process. After cleaning, a thermal furnace process is preformed to grow a SiO$_2$ film serving as an insulating layer 202 on the substrate 200 to isolate leakage current from the substrate 200. Then, an E-beam evaporation or sputtering process is performed to form the Ti film 204 on the insulating layer 202. Likewise, another E-beam evaporation or sputtering process is performed to form the Pt film 206 on the Ti film 204. The Ti film 204 and the Pt film 206, together, both construct the bottom conductive layer 207. Then, a radio-frequency (RF) magnetron sputtering process is performed to form a ZrO$_2$ film as a resistive switching layer 208 on the Pt film 206. In one embodiment, the resistive switching layer 208 such as a ZrO$_2$ film is formed by a process of at 200° C., a plasma power density of about 2.63 W/cm$^2$, working pressure of 10 mTorr and a gas flow rate of 18 sccm (the ratio between Ar and O$_2$ is 12:6).

The following description will describe a formation of one exemplary embodiment of an oxygen vacancy barrier layer 210 of the non-volatile memory 500 of the invention. A radio-frequency (RF) magnetron sputtering process is performed to form the oxygen vacancy barrier layer 210 on the resistive switching layer 208. The oxygen vacancy barrier layer 210 may comprise a ZrO$_2$ film having a metal oxide dopant, for example, a CaO-doped ZrO$_2$ (CaO:ZrO$_2$) film. In one embodiment, the oxygen vacancy barrier layer 210 is formed by a process of at 200° C., a plasma power density of the RF magnetron sputtering process of about 2.63 W/cm$^2$, working pressure of 10 mTorr and a gas flow rate of 18 sccm (the ratio between Ar and O$_2$ is 12:6). Alternatively, the metal oxide dopant of the oxygen vacancy barrier layer 210 may comprise CaO, MgO, Y$_2$O$_3$ or combinations thereof.

Lastly, an E-beam evaporation process and a patterning process with a metal mask, which defines an area and a position of the upper electrode, are performed to form a Ti film on the oxygen vacancy barrier layer 210 as an upper conductive layer 212 (also serving as an upper electrode 212) on the oxygen vacancy barrier layer 210. As a result, a non-volatile memory 500 of an exemplary embodiment of the present invention is formed.

Figure 1B:
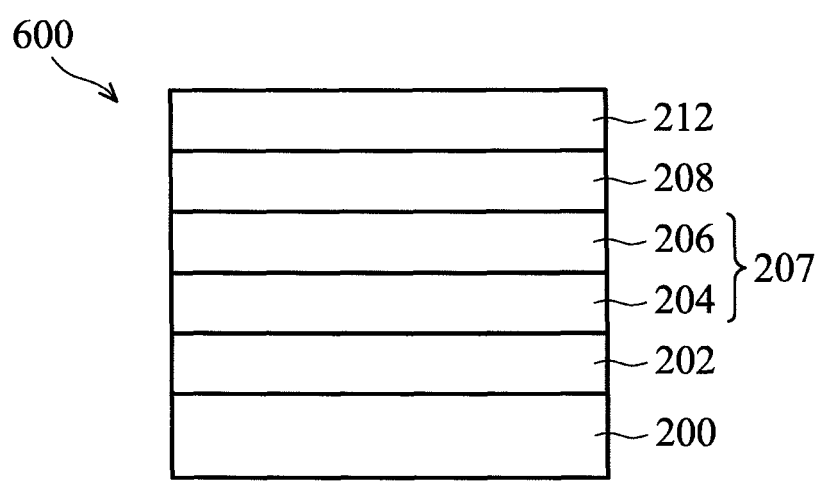
FIG. 1*b* is a cross section showing one comparative embodiment of a non-volatile memory.

FIG. 1b is a cross section showing one comparative embodiment of a non-volatile memory 600. The only difference between the non-volatile memory 600 and the non-volatile memory 500 is that the non-volatile memory 600 does not have an oxygen vacancy barrier layer of a CaO-doped ZrO$_2$ (CaO:ZrO$_2$) film. Therefore, an upper electrode 212 of the non-volatile memory 600 is formed directly on a resistive switching layer 208. The remaining elements of the non-volatile memory 600 are equivalent to those of the non-volatile memory 500.

Figure 2A:
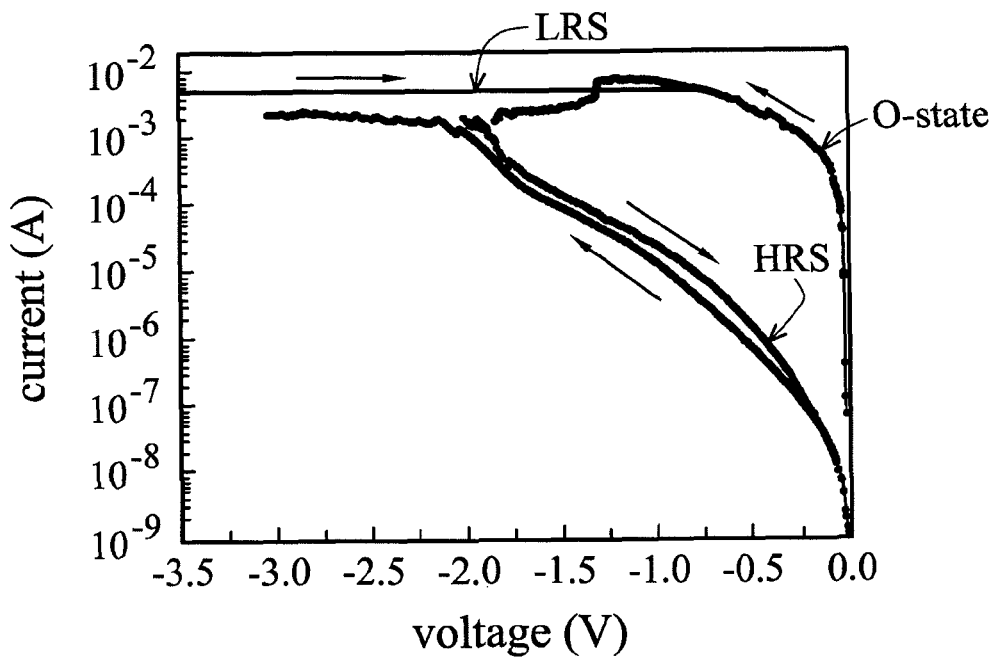
FIG. 2*a* shows a voltage vs. current diagram for one exemplary embodiment of a non-volatile memory of the invention.

FIG. 2a shows a voltage vs. current measurement result for one exemplary embodiment of the non-volatile memory 500 of the invention. As shown in FIG. 2a, when a positive (negative) bias voltage is applied to the non-volatile memory 500, a current through the non-volatile memory 500 increases as the bias voltage is increased. If a current through the non-volatile memory 500 increases to a current limit (5 mA), the bias voltage serves as a forming voltage. The forming voltage usually has a large value. At this time, a conduction path is formed in the resistive switching layer 208, and the non-volatile memory 500 switches from an original state (O-state) to a low resistance state (LRS, or referred to as ON-state). Next, when a negative biased turn-off voltage is applied to the non-volatile memory 500, the non-volatile memory 500 starts to decrease the current therethrough at around −1.2V bias voltage, and the non-volatile memory 500 suddenly returns the current therethrough to its original current value at around −2V bias voltage. At this time, the conduction path in the resistive switching layer 208 is cut off, and the current of the non-volatile memory 500 switches from the low resistance state (LRS, or referred to as ON-state) to a high resistance state (HRS, or referred to as OFF-state). When a negative biased turn-on voltage is applied to the non-volatile memory 500, a current through the non-volatile memory 500 increases as the bias voltage is increased, and the non-volatile memory 500 increases to a current limit (5 mA) at around −3V bias voltage. At this time, the non-volatile memory 500 switches from HRS to LRS. The switching between the various resistance states is repeatable, i.e., the resistance states of the non-volatile memory 500 can be converted or switched by way of changing the magnitude of a bias voltage so as to achieve a memory function. The feature that the high resistance state and the low resistance state of the non-volatile memory 500 can both be maintained a memory state without any power supply can be implemented for applications to non-volatile memories. As shown in FIG. 2a, it is noted that the turn-off voltage and the turn-on voltage of the non-volatile memory 500 are respectively about −1.5V and −3V, which are both negative voltages. The non-volatile memory 500 has a unipolar resistive switching behavior, and can be associated with a diode to form a 1D1R (e.g. one diode and one resistor) resistive non-volatile memory.

Figure 2B:
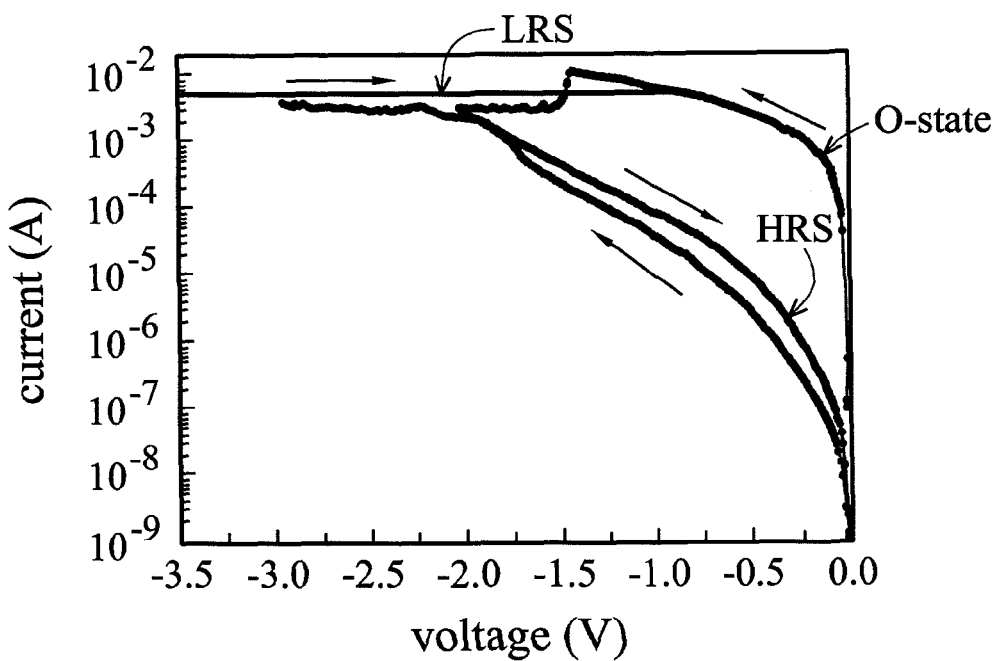
FIG. 2*b* shows a voltage vs. current diagram for one comparative embodiment of a non-volatile memory.

FIG. 2b shows a voltage vs. current measurement result for one comparative embodiment of a non-volatile memory 600 of the invention. When a negative biased turn-off voltage is applied to the non-volatile memory 600, the current through the non-volatile memory 600 start to decrease at around −1.4V bias voltage, and the non-volatile memory 600 suddenly returns the current therethrough to its original current value at around −2V bias voltage. At this time, the non-volatile memory 600 switches from an LRS to a HRS. Next, when a negative biased turn-on voltage is applied to the non-volatile memory 600, a current through the non-volatile memory 600 increases as the bias voltage is increased, and the non-volatile memory 600 increases to a current limit (5 mA) at around −3V bias voltage. At this time, the non-volatile memory 600 switches from the HRS to the LRS. The switching between the various resistance states is repeatable. The measurement results illustrates that the comparative embodiment of the non-volatile memory 600 and the exemplary embodiment of the non-volatile memory 500 have similar voltage vs. current performances, indicating that the non-volatile memory 600 also has unipolar resistive switching behavior. However, the endurance test as shown in FIGS. 3a to 6 illustrates that the non-volatile memory 500 having the oxygen vacancy barrier layer has better endurance performance than the non-volatile memory 600 without the oxygen vacancy barrier layer.

The resistive switching mechanism of one exemplary embodiment of a non-volatile memory 500 is described as follows. As shown in FIG. 1a, the resistive switching layer 208 and the overlying oxygen vacancy barrier layer 210 of the non-volatile memory 500 together form the bilayered oxide film structure 209, wherein the oxygen vacancy barrier layer 210 may be, for example, a $ZrO_2$ film having a metal oxide dopant, and the metal oxide dopant comprising CaO, MgO or $Y_2O_3$ serves as a stabilizer for $ZrO_2$, so that a crystalline state of $ZrO_2$ can be maintained in a cubic phase at high temperatures without phase transition caused by temperature variation and cracking caused by volume variation when the temperature is decreased. Therefore, electrical and mechanical performances of the oxygen vacancy barrier layer can be improved. Further, the metal oxide dopant can be adjusted to control the oxygen vacancy concentration of $ZrO_2$, so that the oxygen vacancy barrier layer such as a $ZrO_2$ layer may have better ionic conductivity and superior mechanical strength. The metal oxide dopant such as CaO may provide oxygen vacancies, and the defect reaction equation (1) is as shown:

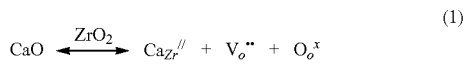

$$CaO \xrightleftharpoons{ZrO_2} Ca_{Zr}'' + V_o^{\bullet\bullet} + O_o^x \qquad (1)$$

By doping 1 mole CaO into $ZrO_2$, 1 mole oxygen vacancy would be generated. Therefore, oxygen ions of the oxygen vacancy barrier layer 210 can be diffused through the oxygen vacancies, thereby obtaining better ionic conductivity.

Figure 3A:
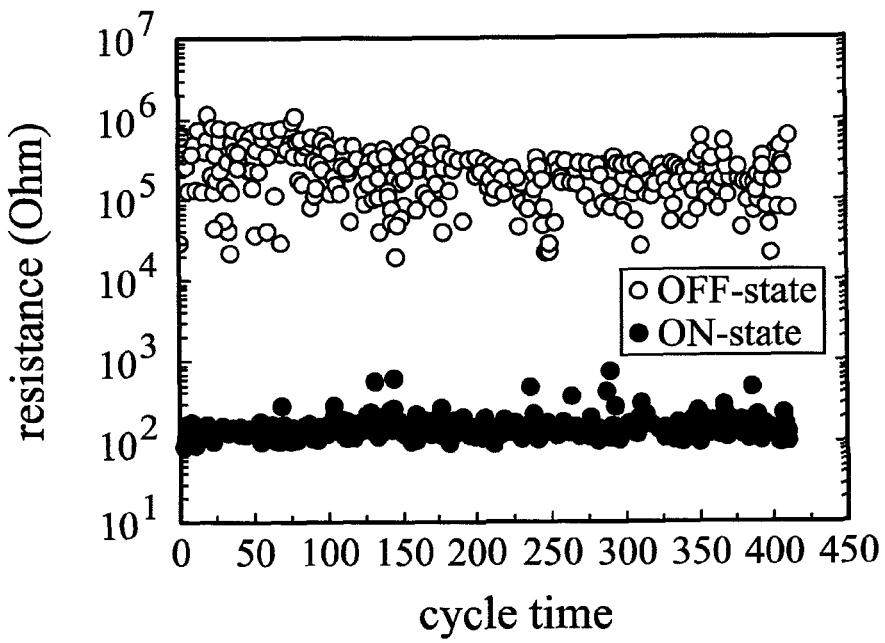
FIG. 3*a* shows an endurance test result for one exemplary embodiment of a non-volatile memory of the invention.

FIG. 3a shows an endurance test result for one exemplary embodiment of a non-volatile memory 500 of the invention. The endurance test is performed by applying a bias voltage to the upper conductive layer 212 of the non-volatile memory 500 and grounding (GND) the bottom conductive layer 207 of the non-volatile memory 500. The HRS (illustrated as OFF-state in FIG. 3a) and LRS (ON-state illustrated as in FIG. 3a) of the non-volatile memory 500 show currents both read under continuously resistive switching operations by applying −0.3V bias voltage. The resistive ratio for the HRS to the LRS of the non-volatile memory 500 is maintained at around 100 over 400 times of continuous resistive switching operations. The endurance test results illustrate that the non-volatile memory 500 having the oxygen vacancy barrier layer has excellent endurance performance.

Figure 3B:
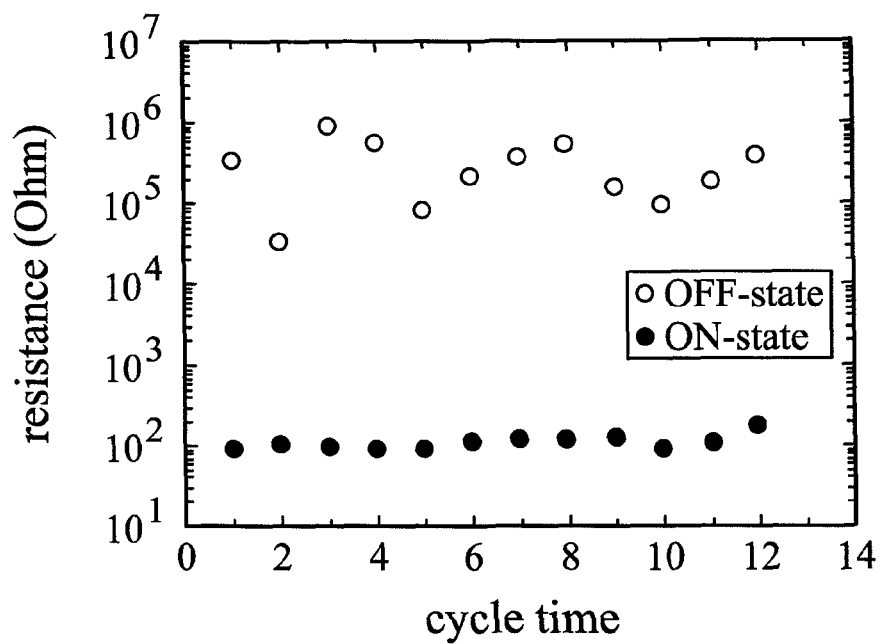
FIG. 3*b* shows an endurance test result for one comparative embodiment of a non-volatile memory.

FIG. 3b shows an endurance test result for one comparative embodiment of a non-volatile memory 600 of the invention. The test conditions of endurance are equivalent to those described in FIG. 3a. As shown in FIG. 3b, the resistive ratio for the HRS to the LRS of the non-volatile memory 600 is maintained at around 100 over 12 times of continuous resistive switching operations. As shown in FIGS. 3a and 3b, however, the number of the resistive switching for the non-volatile memory 500 is more than 35 times that of the non-volatile memory 600. Therefore, the non-volatile memory 500 having the oxygen vacancy barrier layer of a CaO-doped $ZrO_2$ ($CaO:ZrO_2$) film can dramatically increase endurance and stability under unipolar resistive switching operations.

Figure 4:
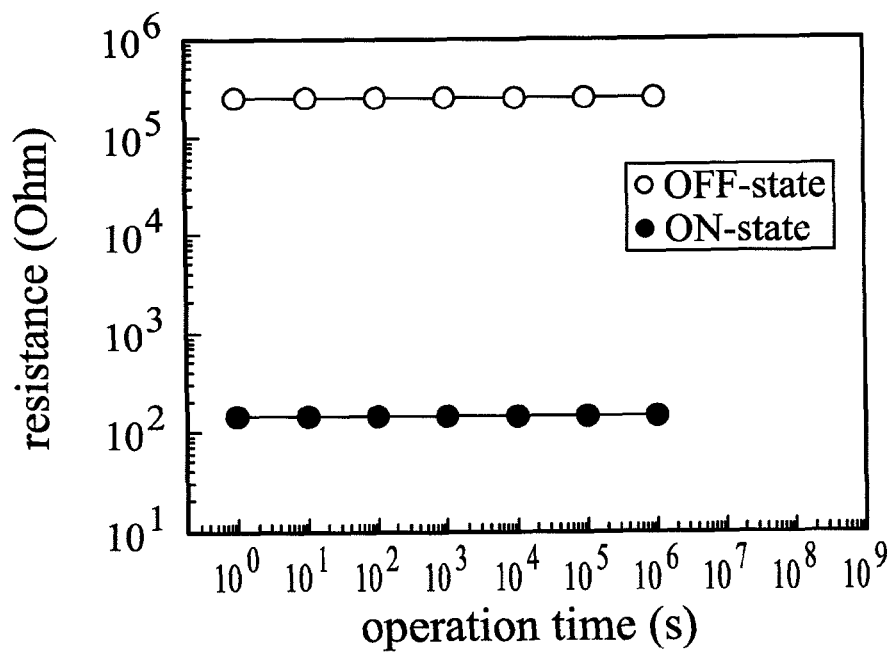
FIG. 4 shows a data retention test result for one exemplary embodiment of a non-volatile memory of the invention.

FIG. 4 shows a data retention test result for one exemplary embodiment of a non-volatile memory 500 of the invention. The test conditions for data retention are that the non-volatile memory 500 is applied a −1.5V turn-off voltage and a 3V turn-on voltage, by which the non-volatile memory 500 is switched to an LRS and an HRS, respectively. Next, the currents of the non-volatile memory 500 at the HRS (illustrated as OFF-state in FIG. 4) and LRS (ON-state illustrated as in FIG. 4) are read by applying a −0.3V bias voltage. The resistance state of the non-volatile memory 500 can be correctly read without any memory degradation even through the non-volatile memory 500 was disposed over a time period of $10^6$ seconds. In the meanwhile, the resistive ratio for the HRS to the LRS of the non-volatile memory 500 is held at over 1000.

Figure 5:
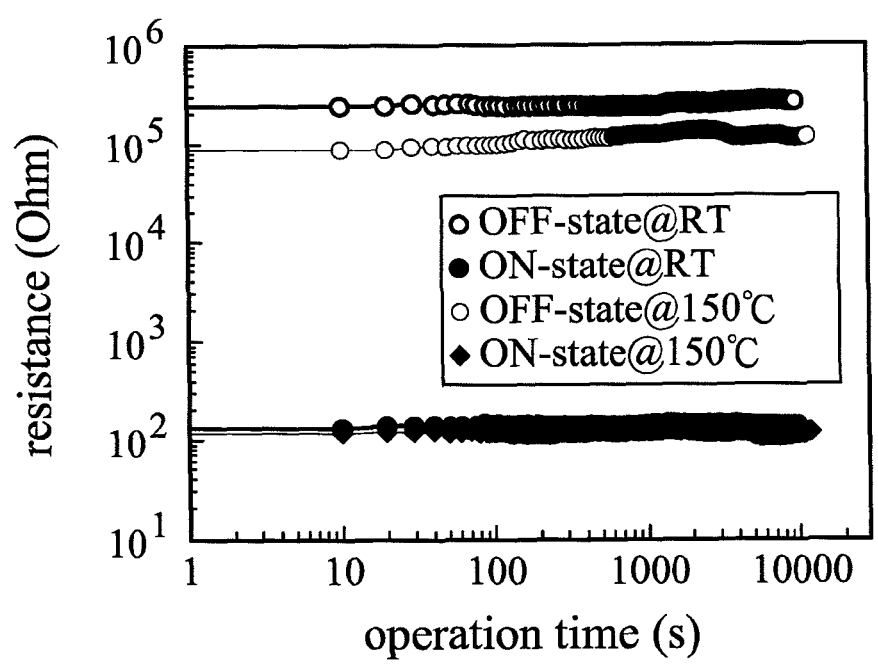
FIG. 5 shows a nondestructive reading test result for one exemplary embodiment of a non-volatile memory of the invention.

FIG. 5 shows a nondestructive reading test result for one exemplary embodiment of a non-volatile memory 500 of the invention. The test conditions of nondestructive reading test are that the non-volatile memory 500 is applied a 1.5 turn-off voltage and a 3V turn-on voltage, by which the non-volatile memory 500 is switched to an LRS and an HRS, respectively. Next, the resistances of the non-volatile memory 500 at HRS (illustrated as OFF-state in FIG. 5) or LRS (ON-state illustrated as in FIG. 5) are continuously read by applying a −0.3V bias voltage. Regardless of being under room temperature (illustrated as RT in FIG. 5) or a high temperature (150° C.), the resistive ratio for the HRS to the LRS of the non-volatile memory 500 is held at more than 800 over 10000 seconds of continuous reading operations without any memory degradation.

Figure 6:
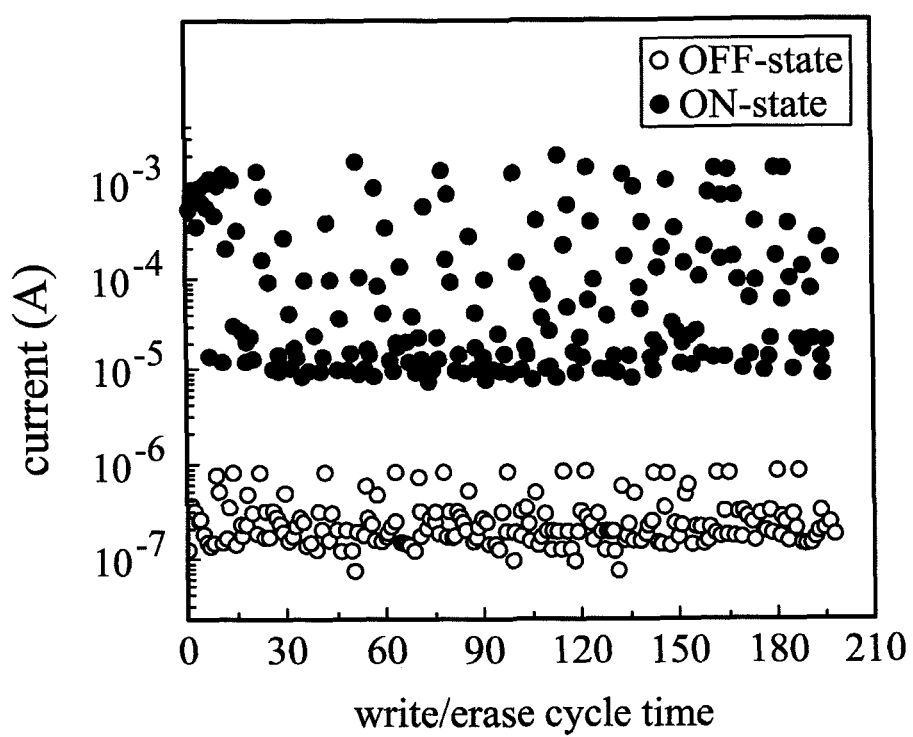
FIG. 6 shows a voltage pulse endurance test result for one exemplary embodiment of a non-volatile memory of the invention.

FIG. 6 shows a voltage pulse endurance test result for one exemplary embodiment of a non-volatile memory 500 of the invention. The voltage pulse endurance is used to determine endurance of a non-volatile memory under high-speed (short pulse time) operations. The test conditions of voltage pulse endurance comprise applying a turn-on voltage pulse to the upper conductive layer 212 of the non-volatile memory 500, wherein the voltage pulse had a pulse width of 50 ns and a pulse height of −6V. Therefore, the non-volatile memory 500 was switched from the HRS to the LRS. Sequentially, a turn-off voltage pulse is applied to the non-volatile memory 500, wherein the turn-off voltage pulse had a pulse width of 50 ns and a pulse height of −4V. Therefore, the non-volatile memory 500 is switched from the LRS to the HRS. The turn-on and turn-off voltage pulse endurance test results in FIG. 6 show that the non-volatile memory 500 can be continuously operated for over 200 times. Also, the non-volatile memory 500 exhibits high-speed resistive switching behavior.

As mentioned before, the metal oxide dopant of the oxygen vacancy barrier layer 210 serves as a stabilizer to provide oxygen vacancies. The solubility of the metal oxide dopant in the oxygen vacancy barrier layer 210 relates to temperature and pressure. If the concentration of oxygen vacancies is higher under conditions of a stabilizer totally dissolved in the oxygen vacancy barrier layer 210 and the defect (oxygen vacancies) located within a range without interaction therebetween, the ionic conductivity would be better. The content of the metal oxide dopant of the oxygen vacancy barrier layer 210 changes its ionic conductivity, thereby affecting the reliability of the non-volatile memory 500.

Table 1 illustrates the reliability test result for exemplary embodiments of an oxygen vacancy barrier layer 210 of a non-volatile memory 500 with various metal oxide dopant contents.

| metal oxide dopant content | reliability | | |
|---|---|---|---|
| | endurance (times) | data retention (second) | nondestructive reading (times) (A: RT; B: 150° C.) |
| 0 mol % (e.g. conventional non-volatile memory) | ~10 | >10$^6$ | A >10$^4$ |
| 0.4 mol % | ~90 | >10$^6$ | A >10$^4$ |
| 1.2 mol % | ~70 | >10$^6$ | A >10$^4$ |
| 2 mol % | >400 | >10$^6$ | A, B >10$^4$ |
| 2.8 mol % | ~70 | >10$^6$ | A >10$^4$ |

In Table 1, the non-volatile memory 500 uses a CaO:ZrO$_2$ film as the oxygen vacancy barrier layer 210. As shown in Table 1, the oxygen vacancy barrier layer 210 having the metal oxide dopant with a content of between 1 mol % and 2 mol % has better endurance than the conventional non-volatile memory (0 mol %). The non-volatile memory 500 comprising the oxygen vacancy barrier layer 210 with the metal oxide dopant content of 2.8 mol % serves as a comparative embodiment.

The non-volatile memory 500 uses a precious metal as a bottom electrode, wherein a ZrO$_2$ film is then formed as a resistive switching layer. Next, a CaO-doped ZrO$_2$ (CaO:ZrO$_2$) film is formed as a oxygen vacancy barrier layer. The oxygen vacancy barrier layer formed by the CaO:ZrO$_2$ film may control the oxygen vacancy concentration thereof (the defect reaction equation of the CaO:ZrO$_2$ film is shown as $$CaO \xrightarrow{ZrO_2} Ca_{Zr}'' + V_o^{\cdot\cdot} + O_o^x ).$$

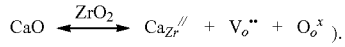

Alternatively, MgO or Y$_2$O$_3$ can be doped into the ZrO$_2$ film to control the oxygen vacancy concentration. Further, an active metal, Ti, may be used as an upper electrode to change the oxide state and distribution within the non-volatile memory, because Ti, the oxygen getter, easily traps oxygen ion in the oxide. Therefore, the resistive switching behavior of the non-volatile memory can be limited to the vicinity of the oxygen vacancy barrier layer, and the operational parameters can be controlled in a narrow range. Compared with the conventional resistive non-volatile memory, embodiments of the non-volatile memory of the invention can improve endurance and stability dramatically under unipolar resistive switching behavior operations. And the bilayered oxide film structure constructed by the resistive switching layer and the overlying oxygen vacancy barrier layer is more suitable for resistive non-volatile memory applications.

While the embodiments have been described, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A non-volatile memory, comprising:
   a bottom conductive layer;
   a resistive switching layer disposed on the bottom conductive layer;
   an oxygen vacancy barrier layer disposed on the resistive switching layer; and
   an upper conductive layer disposed on the oxygen vacancy barrier layer, wherein the resistive switching comprises a first material film and the oxygen vacancy barrier layer comprises a second material film having a metal oxide dopant, and wherein the first material film is formed of the same material as the second material film.

2. The non-volatile memory as set forth in claim 1, further comprising:
   a substrate disposed underlying the bottom conductive layer; and
   an insulating layer disposed between the bottom conductive layer and the substrate.

3. The non-volatile memory as set forth in claim 1, wherein the bottom conductive layer comprises platinum.

4. The non-volatile memory as set forth in claim 1, wherein the upper conductive layer comprises titanium, titanium nitride or combinations thereof.

5. The non-volatile memory as set forth in claim 2, wherein the insulating layer comprises a silicon dioxide film.

6. The non-volatile memory as set forth in claim 1, wherein the resistive switching layer comprises a ZrO$_2$ film.

7. The non-volatile memory as set forth in claim 1, wherein the oxygen vacancy barrier layer comprises a ZrO$_2$ film having a metal oxide dopant.

8. The non-volatile memory as set forth in claim 7, wherein the metal oxide dopant comprises CaO, MgO, Y$_2$O$_3$ or combinations thereof 9. The non-volatile memory as set forth in claim 7, wherein a content of the metal oxide dopant of the ZrO$_2$ film is between 1 mol % and 2 mol %.

10. The non-volatile memory as set forth in claim 1, wherein when a forming voltage is applied to the non-volatile memory, a conduction path is formed in the resistive switching layer and the non-volatile memory is switched from an original state to a low resistance state, and when a turn-off voltage is applied to the non-volatile memory, the conduction path is cut off and the non-volatile memory is switched from the low resistance state to a high resistance state, wherein the forming voltage and the turn-off voltage are negative voltages.

* * * * *